(12) United States Patent
Sadeghi

(10) Patent No.: US 12,123,709 B2
(45) Date of Patent: Oct. 22, 2024

(54) MEASUREMENT SYSTEM TO MEASURE A THICKNESS OF AN ADJUSTABLE EDGE RING FOR A SUBSTRATE PROCESSING SYSTEM

(71) Applicant: LAM RESEARCH CORPORATION, Fremont, CA (US)

(72) Inventor: Hossein Sadeghi, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 390 days.

(21) Appl. No.: 17/435,510

(22) PCT Filed: Feb. 28, 2020

(86) PCT No.: PCT/US2020/020308
§ 371 (c)(1),
(2) Date: Sep. 1, 2021

(87) PCT Pub. No.: WO2020/180656
PCT Pub. Date: Sep. 10, 2020

(65) Prior Publication Data
US 2022/0146258 A1    May 12, 2022

Related U.S. Application Data

(60) Provisional application No. 62/814,459, filed on Mar. 6, 2019.

(51) Int. Cl.
   *G01B 5/06*    (2006.01)
   *G01B 17/02*   (2006.01)
   *H01J 37/32*   (2006.01)

(52) U.S. Cl.
   CPC .............. *G01B 17/02* (2013.01); *G01B 5/061* (2013.01); *H01J 37/32642* (2013.01); *H01J 37/3299* (2013.01)

(58) Field of Classification Search
   CPC ......... H01L 21/68735; H01L 37/32642; H01L 32/3299; G01B 17/02; G01B 5/061; G01B 17/061; H01J 37/32642; H01J 37/3299
   See application file for complete search history.

(56) References Cited

U.S. PATENT DOCUMENTS

2005/0171730 A1* 8/2005 Mitrovic ........... H01J 37/32935
                                                  702/166
2017/0133283 A1   5/2017 Kenworthy
(Continued)

FOREIGN PATENT DOCUMENTS

| JP | 2018032857 A | 3/2018 |
| TW | 201640556 A | 11/2016 |
| TW | 201737290 A | 10/2017 |

OTHER PUBLICATIONS

International Search Report and Written Opinion of the ISA issued in PCT/US2020/020308, mailed Jun. 26, 2020; ISA/KR.
(Continued)

*Primary Examiner* — Daniel J Colilla

(57) ABSTRACT

A measurement system to measure at least one of a height and a thickness of an edge ring in a plasma processing chamber includes an ultrasound transducer configured to output an ultrasound signal into the edge ring and to receive a reflected signal from the edge ring. A controller is configured to cause the ultrasound transducer to generate the ultrasound signal and to determine a thickness of the edge ring based on timing of the ultrasound signal and the reflected signal.

15 Claims, 13 Drawing Sheets

(56) References Cited

U.S. PATENT DOCUMENTS

| | | |
|---|---|---|
| 2017/0213758 A1 | 7/2017 | Rice et al. |
| 2017/0287682 A1 | 10/2017 | Musselman et al. |
| 2017/0301578 A1* | 10/2017 | Hong ................ H01J 37/32862 |
| 2018/0061696 A1 | 3/2018 | D'Ambra et al. |
| 2018/0218933 A1 | 8/2018 | Luere et al. |
| 2019/0348317 A1 | 11/2019 | D'Ambra et al. |
| 2020/0273678 A1* | 8/2020 | Funk ................ H01J 37/32642 |
| 2020/0273681 A1* | 8/2020 | Son ................ H01L 21/67769 |

OTHER PUBLICATIONS

Office Action issued in corresponding Taiwanese Patent Application 109107036 dated Jul. 18, 2023.

* cited by examiner

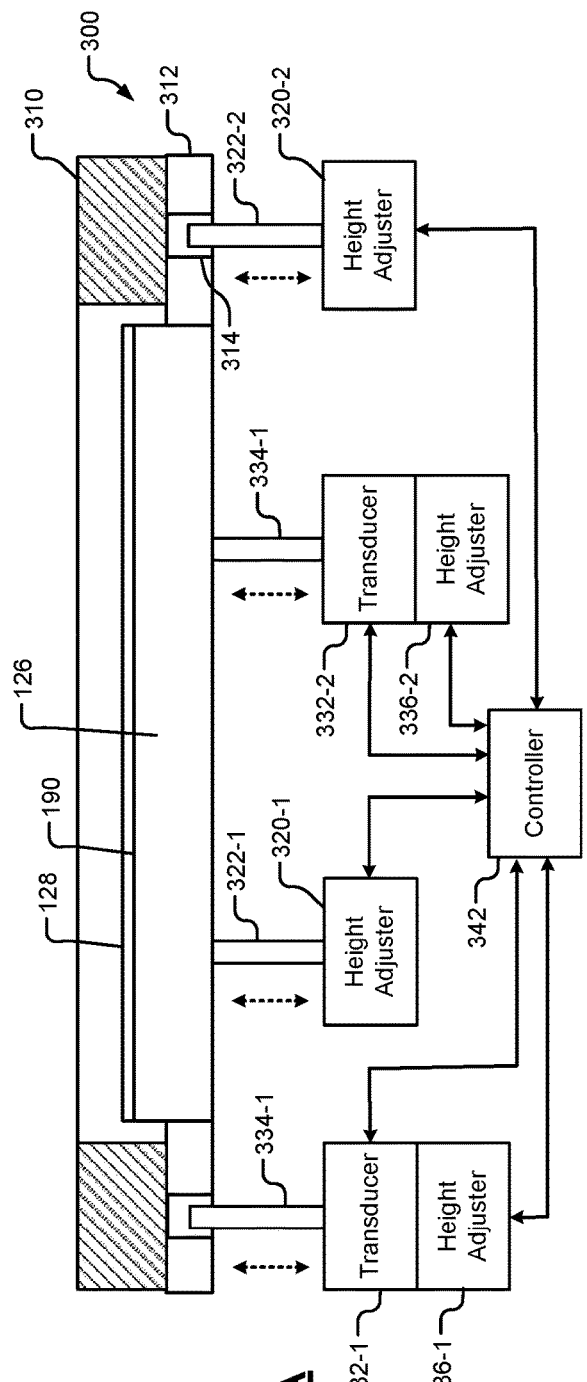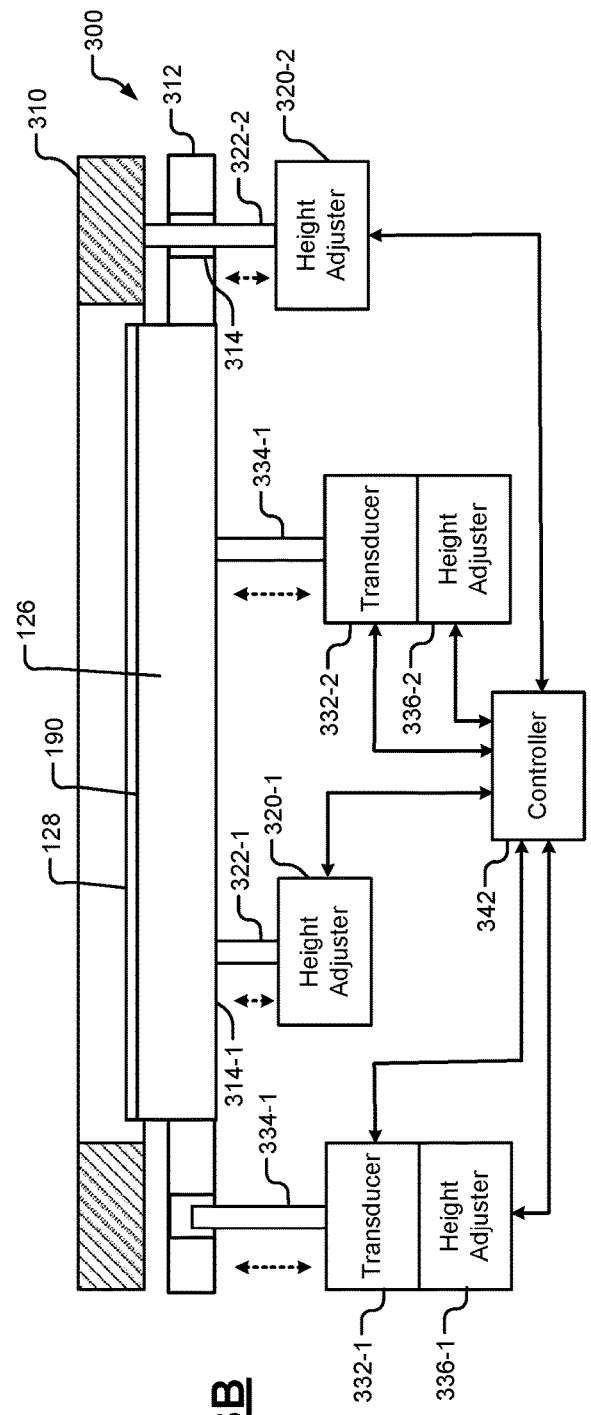

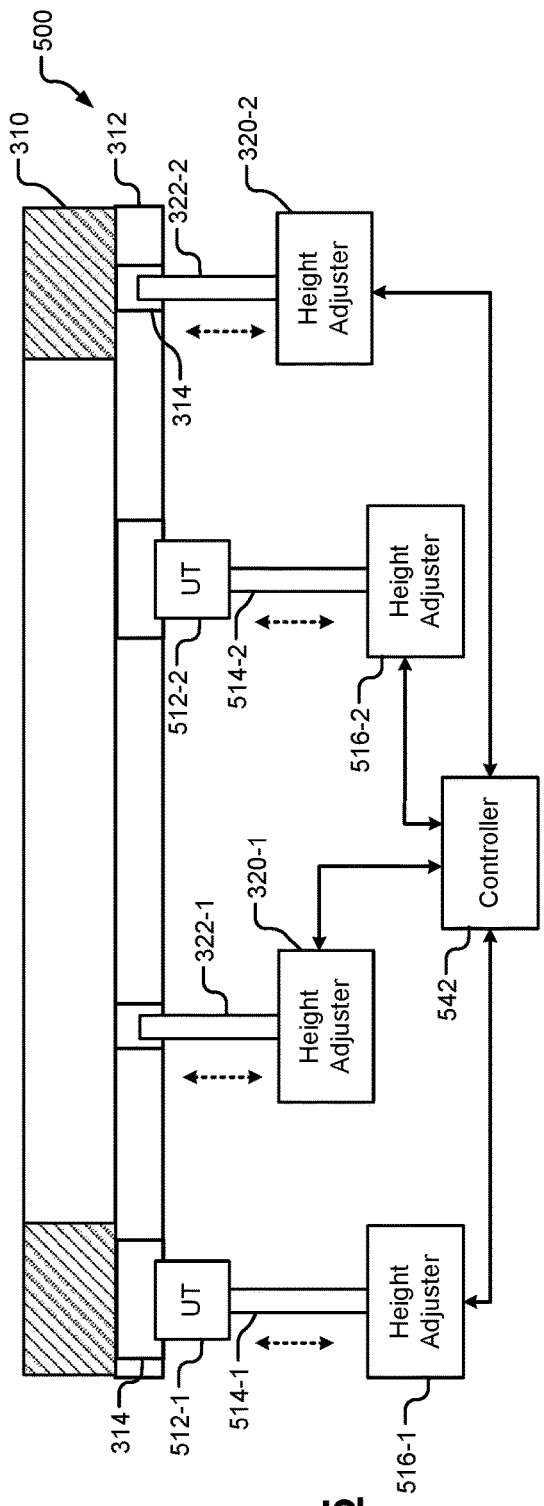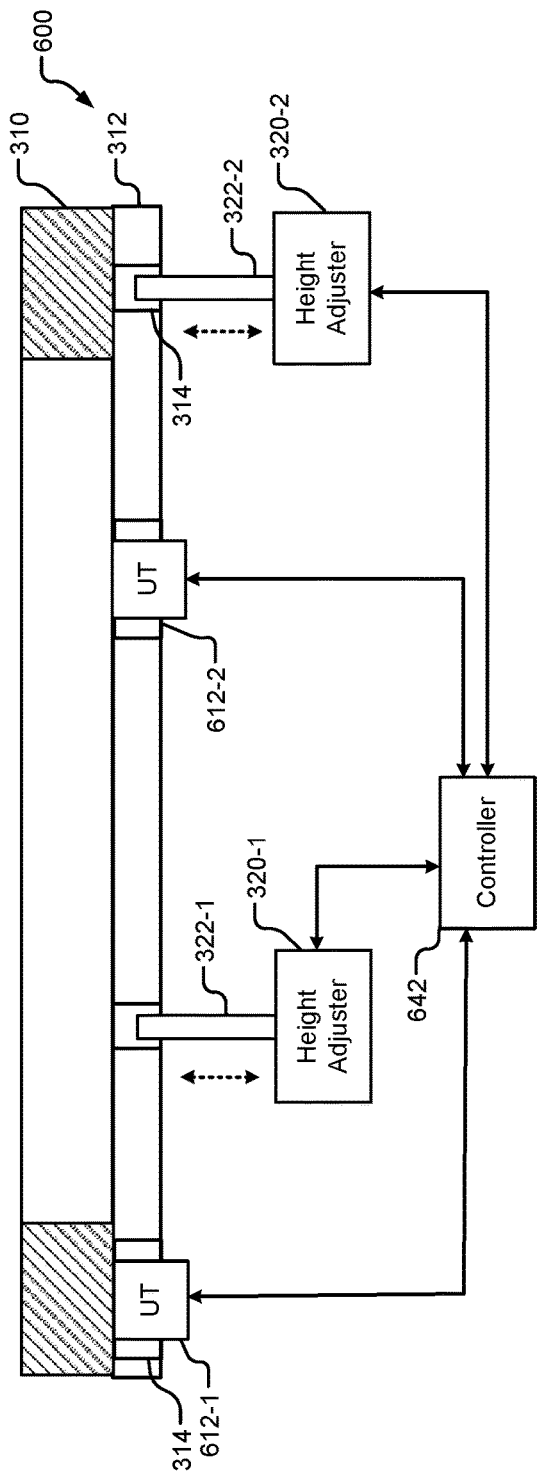
FIG. 5
FIG. 6 ced as prior art against the present disclosure.
MEASUREMENT SYSTEM TO MEASURE A THICKNESS OF AN ADJUSTABLE EDGE RING FOR A SUBSTRATE PROCESSING SYSTEM

CROSS-REFERENCE TO RELATED APPLICATIONS

This application is a U.S. National Phase Application under 35 U.S.C. 371 of International Application No. PCT/US2020/020308, filed on Feb. 28, 2020, which claims priority to U.S. Provisional Patent Application No. 62/814,459, filed on Mar. 6, 2019. The entire disclosures of the applications referenced above are incorporated herein by reference.

FIELD

The present disclosure relates generally to plasma processing systems and more particularly to a measurement system for measuring a thickness of an edge ring of a plasma processing system.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems perform treatments on substrates such as semiconductor wafers. Examples of substrate treatments include deposition, ashing, etching, cleaning and/or other processes. Process gas mixtures may be supplied to the processing chamber to treat the substrate. Plasma may be used to ignite the gases to enhance chemical reactions.

A substrate is arranged on a substrate support during treatment. An edge ring may be used to adjust the effect of the plasma on the substrate. The edge ring is arranged around and adjacent to a radially outer edge of the substrate. During operation, a profile of the edge ring is worn down. The effect of the edge ring on the plasma changes in response to the wear.

SUMMARY

A measurement system to measure at least one of a height and a thickness of an edge ring in a plasma processing chamber includes an ultrasound transducer configured to output an ultrasound signal into the edge ring and to receive a reflected signal from the edge ring. A controller is configured to cause the ultrasound transducer to generate the ultrasound signal and to determine a thickness of the edge ring based on timing of the ultrasound signal and the reflected signal.

In other features, a first height adjuster is configured to adjust a height of the edge ring relative to a surface in the plasma processing chamber. The controller adjusts the height of the edge ring relative to the surface using the first height adjuster based on the thickness. A second height adjuster is configured to move the ultrasound transducer in contact with the edge ring prior to the controller causing the ultrasound transducer to generate the ultrasound signal.

In other features, a pin is arranged between the second height adjuster and the ultrasound transducer. A pin is arranged between the ultrasound transducer and the edge ring. The ultrasound transducer is in direct contact with the edge ring. The controller is configured to selectively cause the edge ring to be replaced in response to the thickness.

In other features, the ultrasound transducer is arranged between the first height adjuster and the edge ring.

A measurement system to measure at least one of a height and a thickness of an edge ring in a plasma processing chamber for substrates includes a weight measuring device selected from a group consisting of a load cell and a strain gauge, the weight measuring device configured to measure a weight of the edge ring. A controller is configured to determine a thickness of the edge ring based on the weight.

In other features, a first height adjuster is configured to adjust a height of the edge ring relative to a surface. Based on the thickness, the controller adjusts the height of the edge ring relative to the surface using the first height adjuster.

In other features, a second height adjuster is configured to move the weight measuring device in contact with the edge ring prior to the weight measuring device measuring the weight of the edge ring. A pin is arranged between the second height adjuster and the weight measuring device. A pin is arranged between the weight measuring device and the edge ring.

In other features, the controller is configured to selectively cause the edge ring to be replaced in response to the thickness. The weight measuring device is arranged between the first height adjuster and the edge ring.

A measurement system to measure at least one of a height and a thickness of an edge ring in a plasma processing chamber for substrates includes a height adjuster including a motor and configured to adjust a height of the edge ring relative to a surface. At least one sensor is configured to sense a parameter of the motor and selected from a group consisting of a current sensor and a voltage sensor. A controller is configured to determine a weight of the edge ring based on an output of the at least one sensor, and to determine a thickness of the edge ring based on the weight.

In other features, using the height adjuster, the controller adjusts the height of the edge ring relative to the surface based on the thickness. A pin is arranged between the height adjuster and the edge ring. The controller is configured to selectively cause the edge ring to be replaced in response to the thickness. A server is located remotely from the controller.

In other features, the controller sends the output of the at least one sensor to the server. A plurality of processing chambers include a controller, a height adjuster and a sensor. The controller of each of the plurality of processing chambers is configured to send an output of the corresponding sensor to the server. The server uses a machine learning algorithm to evaluate a health status of the edge ring based on the output of the at least one sensor and the output of the corresponding sensor of each of the plurality of processing chambers.

A measurement system to measure at least one of a height and a thickness of an edge ring in a plasma processing chamber for substrates includes a speaker disposed at a first distance from the edge ring and configured to transmit a first output signal at the edge ring. A microphone is disposed at a second distance from the edge ring and is configured to measure a reflected signal from the edge ring based on the first output signal. A controller is configured to determine the thickness of the edge ring based on the reflected signal.

In other features, a height adjuster is configured to adjust the height of the edge ring relative to a surface. The controller is configured to cause the height adjuster to adjust the height of the edge ring relative to the surface based on the thickness. The controller is configured to selectively cause the edge ring to be replaced in response to the thickness. The reflected signal includes a first reflected signal and a second reflected signal. The controller determines the thickness based on at least one of the first and second reflected signals.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3A-3C are functional block diagrams of an example of a height monitoring system according to the present disclosure;

FIGS. 5-6 are functional block diagrams of another example of a height monitoring system including ultrasound transducers according to the present disclosure;

In the drawings, reference numbers may be reused to identify similar and/or identical elements.

DETAILED DESCRIPTION

During substrate processing, a substrate is arranged on a pedestal such as an electrostatic chuck (ESC), process gases are supplied, and plasma is struck in the processing chamber. During plasma processing, components within the processing chamber experience wear due to exposure to the plasma.

In some processing chambers, an edge ring is arranged around a radially outer edge of the substrate to shape the plasma. After processing multiple substrates, the edge ring is worn. As a result, the effect of the edge ring on the substrate changes. To reduce the process changes due to edge ring wear, some processing chambers include a height adjuster to adjust the height of the edge ring. In many of these systems, the height of the edge ring is automatically adjusted based upon the number of cycles and/or the total plasma processing exposure period.

Systems and methods according to the present disclosure relate to measurement of a thickness of the edge ring in situ and adjustment of the height of the edge ring in response to the thickness measurement. In some examples, ultrasound transducers are used to measure the thickness of the edge ring. In other examples, a weight measuring device such as a load cell, strain gauge or other devices is used to measure the weight of the edge ring and the thickness of the edge ring is estimated based on the weight. In other examples, current to a motor of a height adjuster is monitored, the weight is estimated based on the current, and the thickness is estimated based on the weight. In still other examples, a speaker and a microphone are used to determine the thickness of the edge ring. Once the thickness has been determined, the controller can adjust the height of the edge ring or cause a robot to replace the edge ring without breaking vacuum.

Figure 1A:
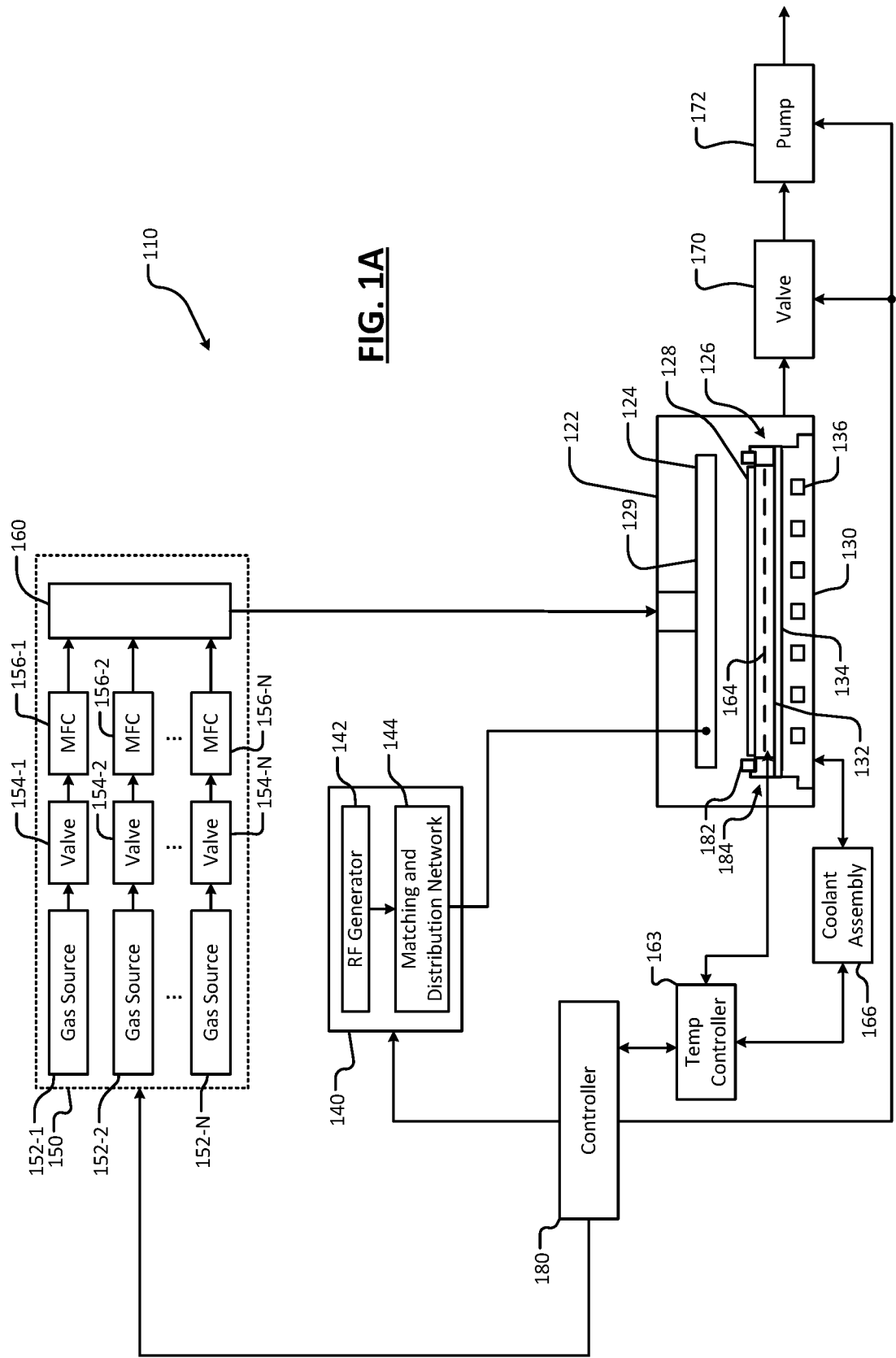
FIG. 1A is a functional block diagram of an example of a capacitively coupled plasma (CCP) substrate processing system with a height monitoring system according to the present disclosure.
Figure 2:
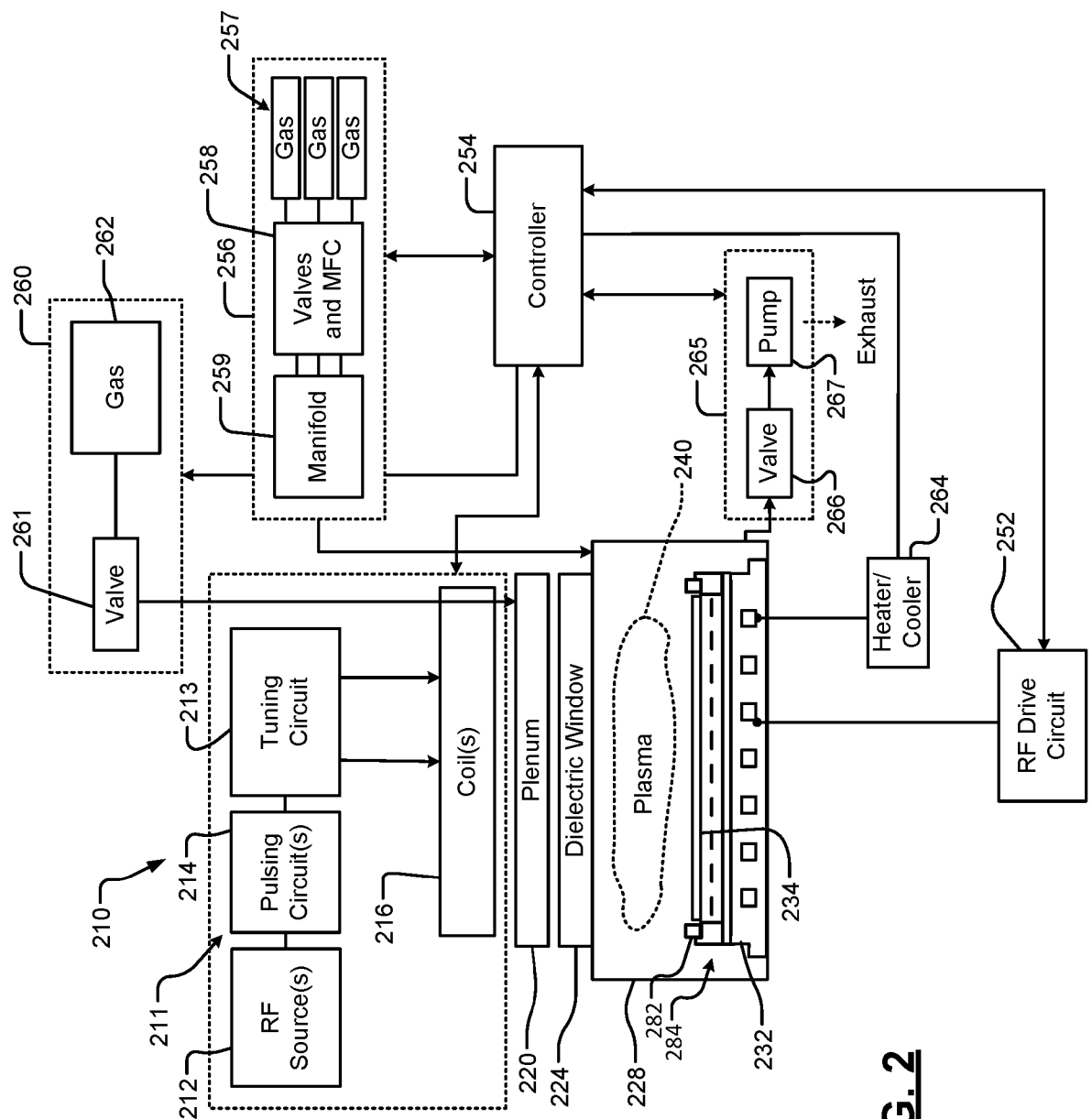
FIG. 2 is a functional block diagram of an example of an inductively coupled plasma (ICP) substrate processing system with a height monitoring system according to the present disclosure.

Referring now to FIGS. 1A and 2, examples of plasma processing chambers that may use edge rings are shown. As can be appreciated, other types of plasma processing chambers can be used. In FIG. 1A, an example of a substrate processing system 110 according to the present disclosure is shown. The substrate processing system 110 includes a processing chamber 122 that encloses other components of the substrate processing system 110 and contains the RF plasma (if used). The substrate processing system 110 includes an upper electrode 124 and a substrate support 126 such as an electrostatic chuck (ESC). During operation, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A thermal resistance layer 134 may be arranged between the heating plate 132 and the baseplate 130. The baseplate 130 may include one or more channels 136 for flowing coolant through the baseplate 130.

An RF generating system 140 generates and outputs an RF voltage to one of the upper electrode 124 and the lower electrode (e.g., the baseplate 130 of the substrate support 126). The other one of the upper electrode 124 and the baseplate 130 may be DC grounded, AC grounded or floating. For example only, the RF generating system 140 may include an RF generator 142 that generates RF plasma power that is fed by a matching and distribution network 144 to the upper electrode 124 or the baseplate 130. In other examples, the plasma may be generated inductively or remotely.

A gas delivery system 150 includes one or more gas sources 152-1, 152-2, . . . , and 152-N (collectively gas sources 152), where N is an integer greater than zero. The gas sources 152 are connected by valves 154-1, 154-2, . . . , and 154-N (collectively valves 154) and MFCs 156-1, 156-2, . . . , and 156-N (collectively MFCs 156) to a manifold 160. Secondary valves may be used between the MFCs 156 and the manifold 160. While a single gas delivery system 150 is shown, two or more gas delivery systems can be used.

A temperature controller 163 may be connected to a plurality of thermal control elements (TCEs) 164 arranged in the heating plate 132. The temperature controller 163 may be used to control the plurality of TCEs 164 to control a temperature of the substrate support 126 and the substrate 128. The temperature controller 163 may communicate with a coolant assembly 166 to control coolant flow through the channels 136. For example, the coolant assembly 166 may include a coolant pump, a reservoir and/or one or more temperature sensors. The temperature controller 163 operates the coolant assembly 166 to selectively flow the coolant through the channels 136 to cool the substrate support 126.

A valve 170 and pump 172 may be used to evacuate reactants from the processing chamber 122. A system controller 180 may be used to control components of the substrate processing system 110. An edge ring 182 may be arranged radially outside of the substrate 128 during plasma processing. An edge ring height adjustment system 184 may be used to adjust a height of a top surface of the edge ring 182 relative to the substrate 128 as will be described further below.

Figure 1B:
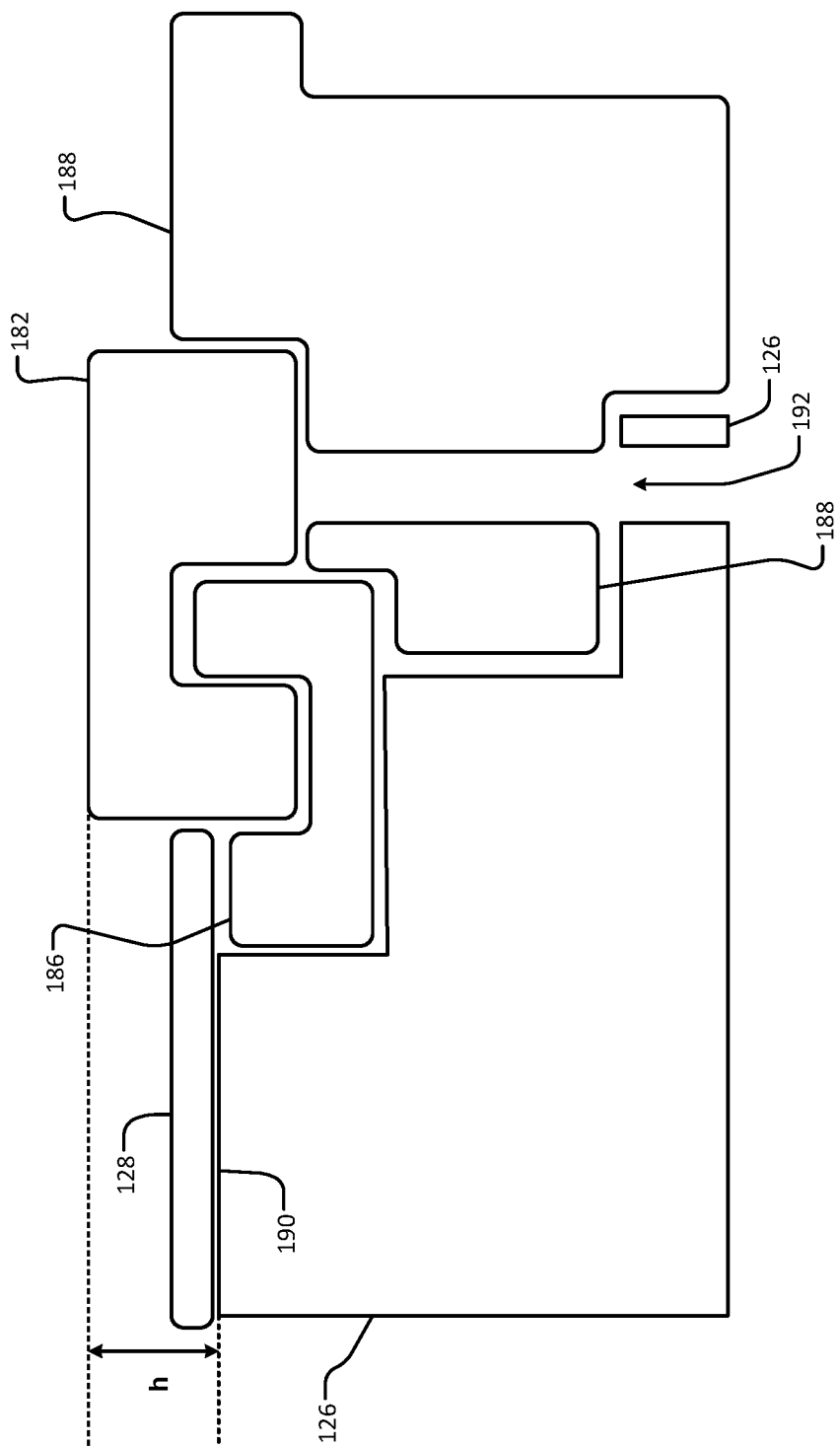
FIGS. 1B and 1C are cross-sectional views of an example of the substrate support and edge rings according to the present disclosure.
Figure 1C:
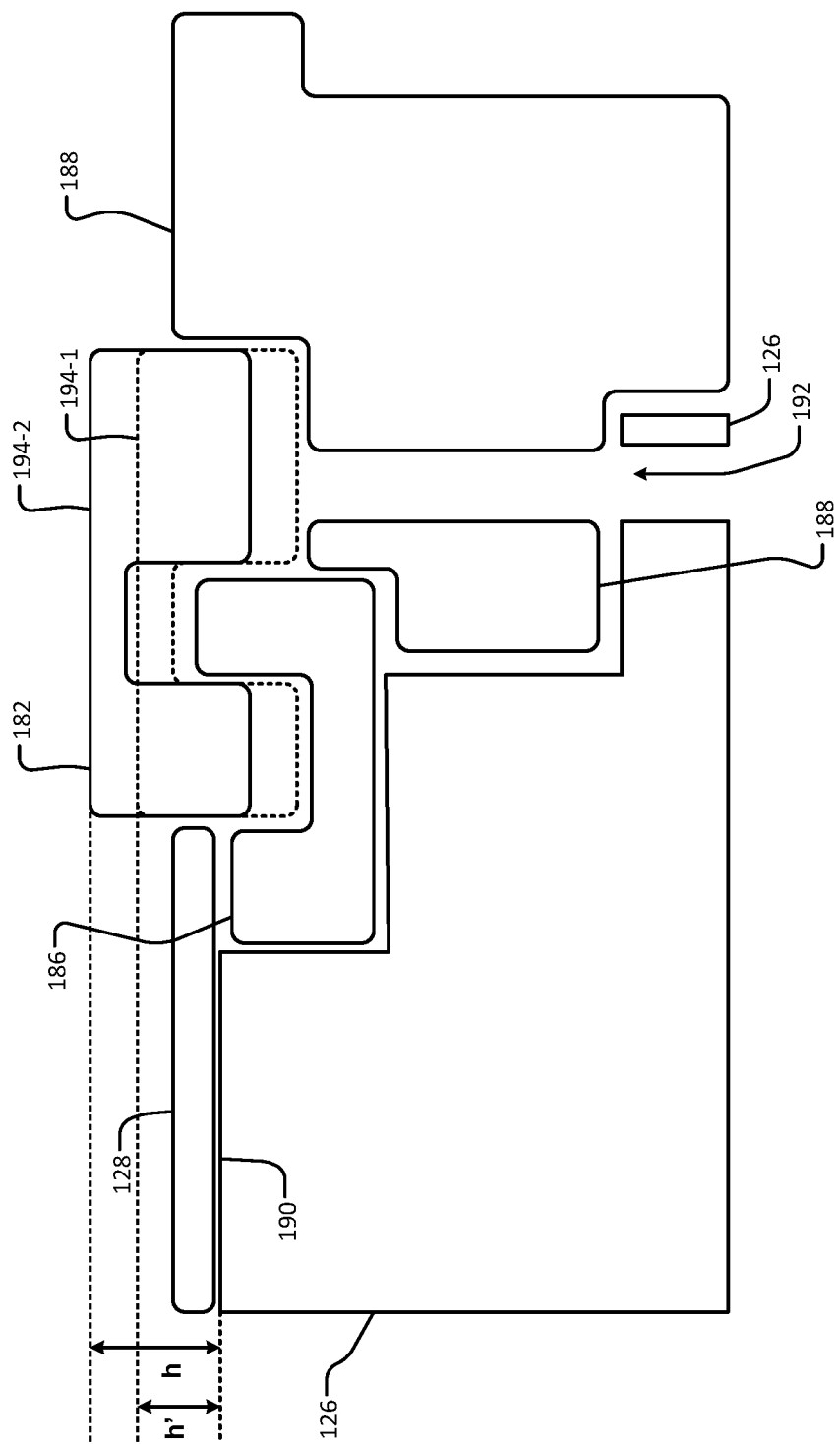

Referring now to FIGS. 1B and 1C, in some examples the substrate 128 rests on an upper surface 190 of the substrate support 126 (or ESC). In FIG. 1B, the edge ring 182 rests on a middle edge ring 186 and a bottom edge ring 188. The middle edge ring 186 and the bottom edge ring 188 are not directly exposed to the plasma and are not generally removed. The edge ring 182 defines a height h above the surface 190 when the edge ring 182 is resting on the middle edge ring 186 and the bottom edge ring 188 and the edge ring 182 is not worn. One or more openings 192 may be defined in one or more of the substrate support 126, the middle edge ring 186 and/or the bottom edge ring 188 to allow a height adjuster to adjust the height of the edge ring 182 as will be described further below.

In FIG. 1C, the edge ring 182 is worn and the thickness is reduced to a height h' (h'<h). The height adjuster described further below is used to raise the edge ring 182 to restore the height relationship h between a top surface of the edge ring 182 and the surface 190.

In FIG. 2, an example of a substrate processing system 210 according to the present disclosure is shown. The substrate processing system 210 includes a coil driving circuit 211. A pulsing circuit 214 may be used to pulse the RF power on and off or vary an amplitude or level of the RF power. The tuning circuit 213 may be directly connected to one or more inductive coils 216. The tuning circuit 213 tunes an output of the RF source 212 to a desired frequency and/or a desired phase, matches an impedance of the coils 216 and splits power between the coils 216. In some examples, the coil driving circuit 211 is replaced by one of the drive circuits described further below in conjunction with controlling the RF bias.

In some examples, a plenum 220 may be arranged between the coils 216 and a dielectric window 224 to control the temperature of the dielectric window 224 with hot and/or cold air flow. The dielectric window 224 is arranged along one side of a processing chamber 228. The processing chamber 228 further comprises a substrate support (or pedestal) 232. The substrate support 232 may include an electrostatic chuck (ESC), or a mechanical chuck or other type of chuck. Process gas is supplied to the processing chamber 228 and plasma 240 is generated inside of the processing chamber 228. The plasma 240 etches an exposed surface of the substrate 234. A drive circuit 252 (such as one of those described below) may be used to provide an RF bias to an electrode in the substrate support 232 during operation.

A gas delivery system 256 may be used to supply a process gas mixture to the processing chamber 228. The gas delivery system 256 may include process and inert gas sources 257, a gas metering system 258 such as valves and mass flow controllers, and a manifold 259. A gas delivery system 260 may be used to deliver gas 262 via a valve 261 to the plenum 220. The gas may include cooling gas (air) that is used to cool the coils 216 and the dielectric window 224. A heater/cooler 264 may be used to heat/cool the substrate support 232 to a predetermined temperature. An exhaust system 265 includes a valve 266 and pump 267 to remove reactants from the processing chamber 228 by purging or evacuation.

A controller 254 may be used to control the etching process. The controller 254 monitors system parameters and controls delivery of the gas mixture, striking, maintaining and extinguishing the plasma, removal of reactants, supply of cooling gas, and so on. Additionally, as described below in detail, the controller 254 may control various aspects of the coil driving circuit 211 and the drive circuit 252. An edge ring 282 may be located radially outside of the substrate 234 during plasma processing. A height adjustment system 284 may be used to adjust a height of a top surface of the edge ring 282 relative to the substrate 234 based on one or more parameters, including but not limited to, ultrasound, weight, voltage, current and sound, as will be described further below. The controller 254 may be used to control the height adjustment system 284.

Referring now to FIG. 3A-3B, the bottom and middle edge rings have been omitted for purposes of illustration. A height monitoring system 300 determines a height of an edge ring 310 relative to the surface 190 of the substrate support 126 (or another reference surface). In other words, the height monitoring system 300 determines a thickness of the edge ring 310. Since a position of a bottom surface of the edge ring 310 is initially known, a position of the top surface of the edge ring 310 can be determined.

In some examples, the height monitoring system 300 includes height adjusters 320-1, 320-2, . . . , 320-H (collectively height adjusters 320) (where H is an integer greater than zero) that selectively adjust the height of the edge ring 310 relative to the surface 190. In some examples, the height adjusters 320 include pins 322-1, 322-2, . . . , 322-H (collectively pins 322) that may extend through openings 314 in a surface 312. In some examples, the surface 312 can be annular with through holes 314. The component defining surface 312 will vary depending upon the configuration. For example only, the surface 312 can correspond to the ESC 126, the middle edge ring 186, and/or the bottom edge ring 188 (as shown in FIGS. 1B and 1C) or any another surface. Alternately, the pins 322 may be located between the ESC 126, the middle edge ring 186, and/or the bottom edge ring 188. In some examples, three or more height adjusters 320 that are spaced by 360°/H are used.

Prior to measurement, one or more ultrasound transducers 332-1, 332-2, . . . and 332-T (collectively ultrasound transducers 332) are arranged in contact with pins 334-1, 334-2, . . . , 334-T (collectively pins 334) and height adjusters 336-1, 336-2, . . . , 336-T (collectively height adjusters 336) to a bottom surface of the edge ring 310.

A controller 342 controls the ultrasound transducers 332 and the height adjusters 320 and 336 to measure the thickness of the edge ring 310 and adjust a position of the edge ring 310 relative to the surface 190 based on the thickness. In this example, the wave travels from the ultrasound transducers 332 through the pins 334 to the edge ring 310 and back through the pins 334 to the ultrasound transducers 332.

In use, the edge ring 310 is positioned on an upper portion of the surface 312, which may correspond to the middle edge ring 186, the bottom edge ring 188 or another surface. Plasma processing is performed in the processing chamber. After a predetermined number of cycles, plasma processing time and/or a predetermined event, the height adjusters 336 are used to position the pins 334 in contact with the edge ring 310. In some examples, the height adjusters 336 may lift the edge ring 310 slightly above the surface 312 or the pins 322 of the height adjusters 320. The ultrasound transducers 332 transmit a transmitted wave and receive a reflected wave. Based on differences in the timing of the transmitted wave and the reflected wave, the pin material, and the edge ring material, the thickness of the edge ring in the vertical direction can be determined.

If it is determined that the edge ring 310 has worn down sufficiently during the intervening period, the height adjusters 320 may be used to adjust a position of a top surface of the edge ring 310 relative to the surface 190.

Figure 3C:
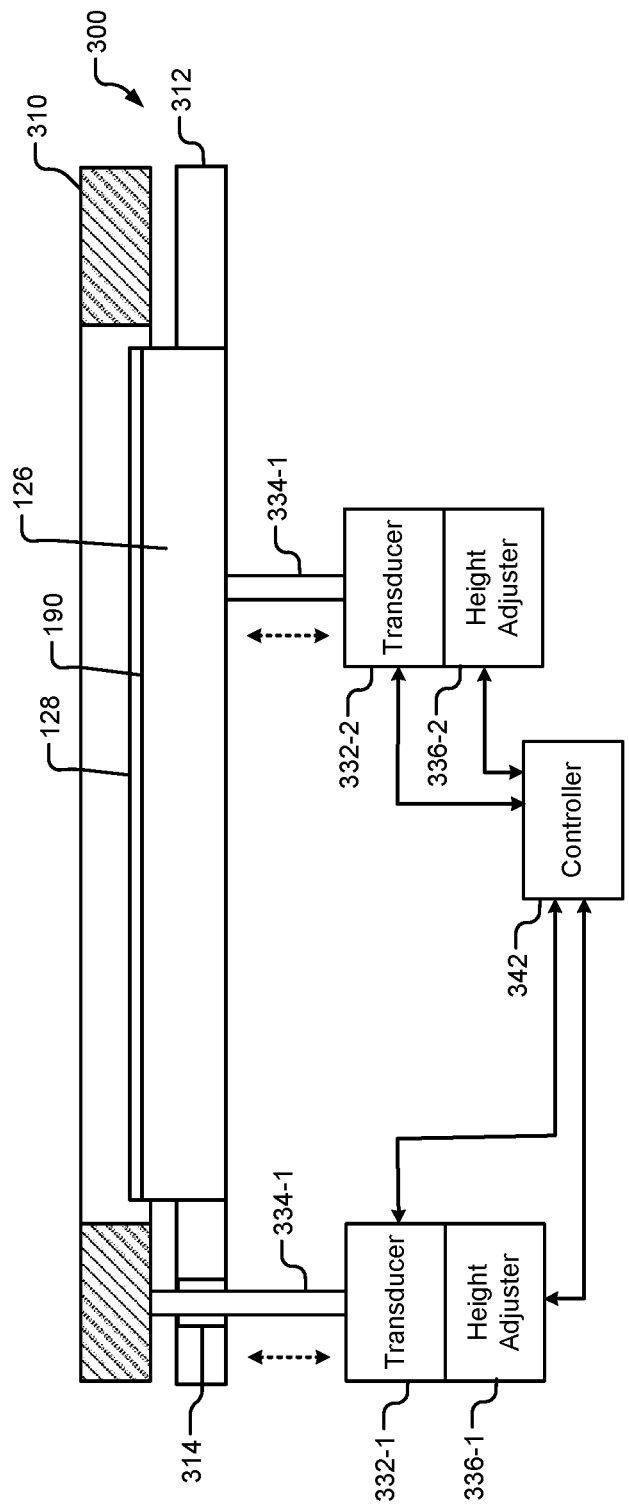

In some examples, the height adjusters 320 and pins 322 can be omitted and the height adjusters 336 can be used to adjust the height of the edge ring 310 during plasma processing and to measure thickness as shown in FIG. 3C.

Figure 3D:
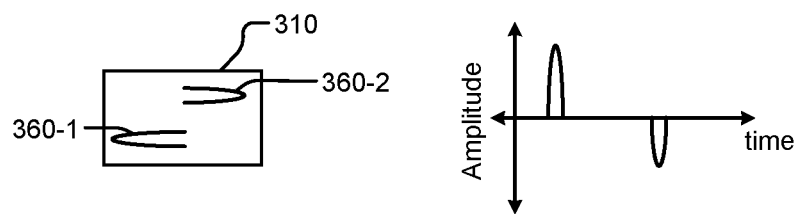
FIG. 3D illustrates an example of an incident wave and a reflected wave that are used to measure a thickness in a vertical direction of the edge ring according to the present disclosure.

Referring now to FIG. 3D, the ultrasound transducer 332 generates a transmitted wave 360-1 that travels towards a top surface of the edge ring 310. The transmitted wave 360-1 is reflected by the top surface of the edge ring 310 and a reflected wave 360-2 travels back to the ultrasound transducer 332. A timing difference between the transmitted wave 360-1 and the reflected wave 360-2 may be used to estimate a thickness of the edge ring 310 in a vertical direction using wave velocity of the edge ring materials.

As can be appreciated, the ultrasound transducers 332 can include normal wave transducers and/or angle beam transducers. Longitudinal wave or shear waves can be used.

Figure 3E:
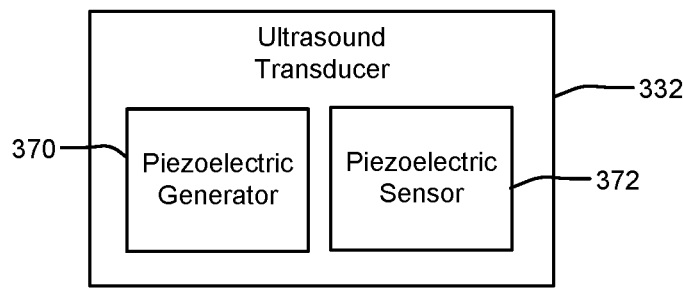
FIG. 3E-3F are functional block diagrams of an example of ultrasound transducers according to the present disclosure.
Figure 3F:
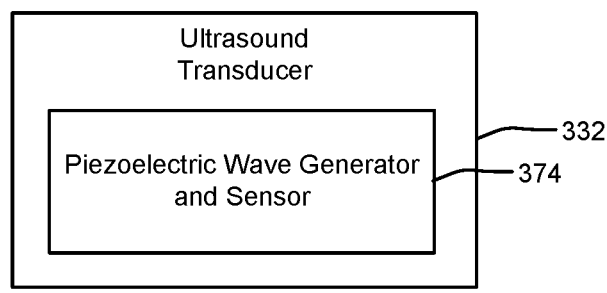

Referring now to FIG. 3E-3F, examples of the ultrasound transducer 332 are shown. In FIG. 3E, the ultrasound transducer 332 is shown to include a piezoelectric generator 370 and a piezoelectric sensor 372. In FIG. 3F, the ultrasound transducer 332 is shown to include a single device including a piezoelectric generator and a piezoelectric sensor 374.

Figure 4:
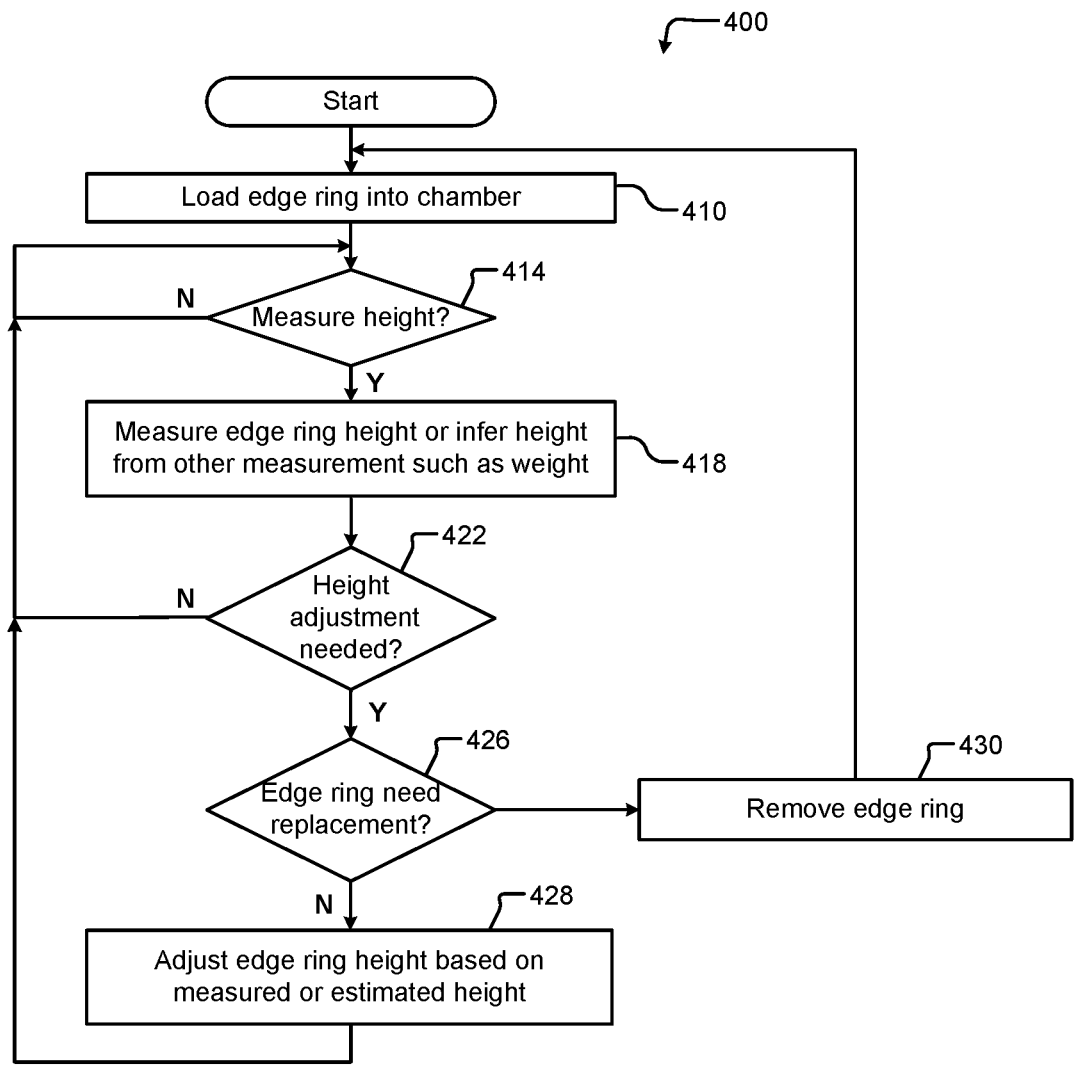
FIG. 4 is a flowchart of a method for operating the height monitoring system according to the present disclosure.

Referring now to FIG. 4, a method 400 for operating the height monitoring system is shown. At 410, an edge ring is loaded into the processing chamber (if an edge ring is not already present). At 414, a thickness of the edge ring may be measured immediately, or after a predetermined plasma processing period, a predetermined number of plasma processing cycles, and/or an event occurs. If 414 is true, the method continues at 418 and measures the edge ring thickness as will be described further below.

At 422, the method determines whether a height adjustment is needed based on the measured thickness. In some examples, the height adjustment is made when the edge ring is worn down by a predetermined amount relative to a prior measurement (or the original thickness). In some examples, the thickness measurement is used to determine a height of a top surface of the edge ring relative to the top surface of the substrate support. If 422 is false, the method returns to 414. If 422 is true, the method determines whether an edge ring replacement is needed based on the measured thickness. The edge ring may be replaced when the thickness is less than a predetermined thickness.

If 426 is true, the edge ring is removed from the processing chamber at 430 manually and the method continues at 410. In some examples, a robot is used to replace the edge ring without breaking vacuum. Otherwise, the method adjusts the edge ring height based on the measured or estimated height at 428. The method continues at 414.

Referring now to FIGS. 5-6, other examples of height monitoring systems including ultrasound transducers are shown. The substrate support 126 and the substrate 128 are omitted for purposes of illustration. In FIG. 5, a height monitoring system 500 includes one or more ultrasound transducers 512-1, 512-2, . . . 512-T (collectively ultrasound transducers 512) connected by pins 514-1, 514-2, . . . 514-T (collectively pins 514) to the height adjusters 516-1, 516-2, . . . 516-T (collectively height adjusters 516). In this example, the ultrasonic transducers 512 are positioned at ends of the pins 514 closest to the edge ring.

In FIG. 5, the ultrasound transducers 512 are shown spaced from the edge ring 310. The ultrasound transducers 512 are moved upwardly and positioned immediately adjacent to and in contact with the bottom surface of the edge ring 310 during measurement to reduce intervening material. In this example, the wave travels through the edge ring 310 (rather than the edge ring and the pins as shown in FIG. 3A). A controller 542 communicates with the height adjusters 516 and 320 and the ultrasound transducers 512. As can be appreciated, the height adjusters 320 may be omitted in a manner similar to FIG. 3C.

In FIG. 6, a height monitoring system 600 includes one or more ultrasound transducers 612-1, 612-2, . . . 612-T (collectively ultrasound transducers 612) that are directly fixedly or removably attached to or in contact with a bottom surface of the edge ring 310. In other examples, the bottom of the edge ring includes a cavity and the ultrasound transducer is located in the cavity. In this example, the thickness measurement may be added to a depth of the cavity. A controller 642 communicates with the height adjusters 320 and the ultrasound transducers 512.

Figure 7A:
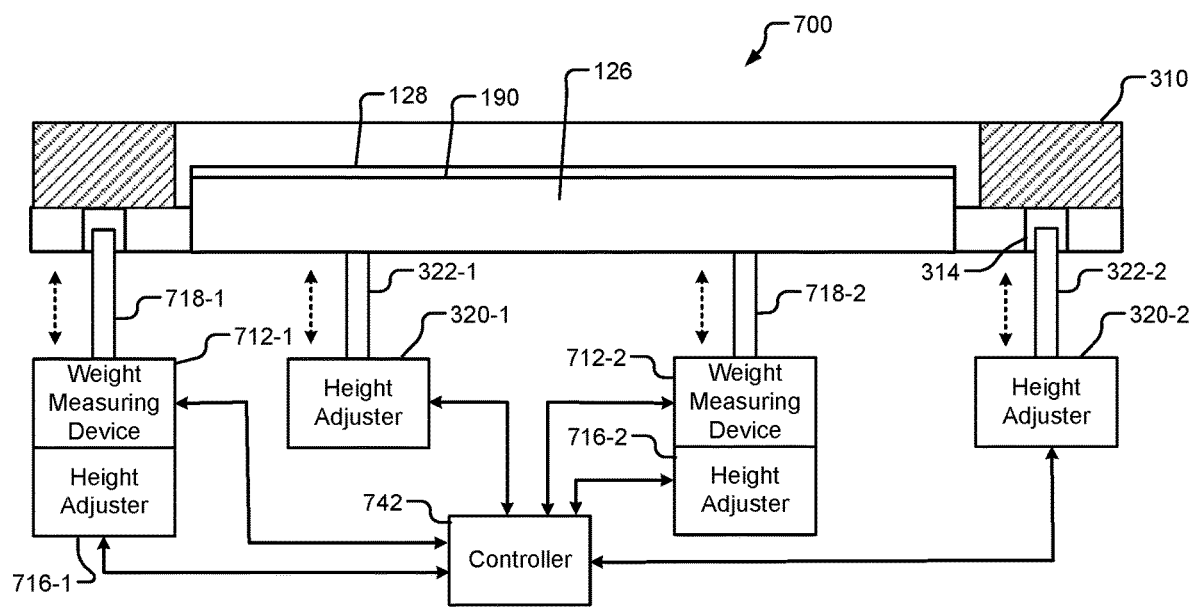
FIG. 7A is a functional block diagram of another example of a height monitoring system including weight measuring devices such as load cells or strain gauges according to the present disclosure.

Referring now to FIG. 7A, a height monitoring system 700 includes weight measuring devices 712-1, 712-2, . . . , and 712-L (collectively weight measuring devices 712) connected to height adjusters 716-1, 716-2, . . . , and 716-L (collectively height adjusters 716) and pins 718-1, 718-2, . . . , and 718-L (collectively pins 718), where L is an integer greater than zero. In some examples, the weight measuring devices 712 include load cells, strain gauges or other weight measuring devices. When a thickness measurement is required, the weight measuring device 712 are used to weigh the edge ring 310. A controller 742 determines the thickness of the edge ring 310 based on the weight.

Figure 7B:
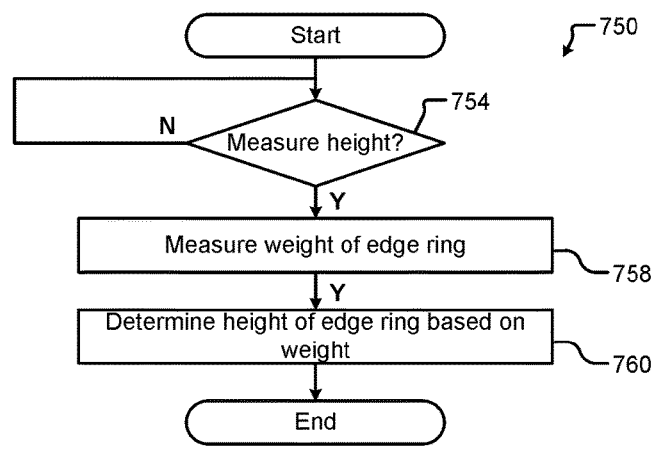
FIG. 7B is a flowchart of a method for operating the height monitoring system of FIG. 7A.

Referring now to FIG. 7B, a method 750 for operating the height monitoring system 700 is shown. As can be appreciated, the steps shown in the method 750 may be performed in a closed loop manner as shown in FIG. 4. At 754, the method determines whether the thickness of the edge ring should be measured. If 754 is true, the weight of the edge ring is measured by the weight measuring devices 712 at 758. At 760, the height of the edge ring 310 relative to the surface is determined based upon the weight. The thickness may be calculated from the cross-sectional area and weight or a lookup table can be used.

Figure 8A:
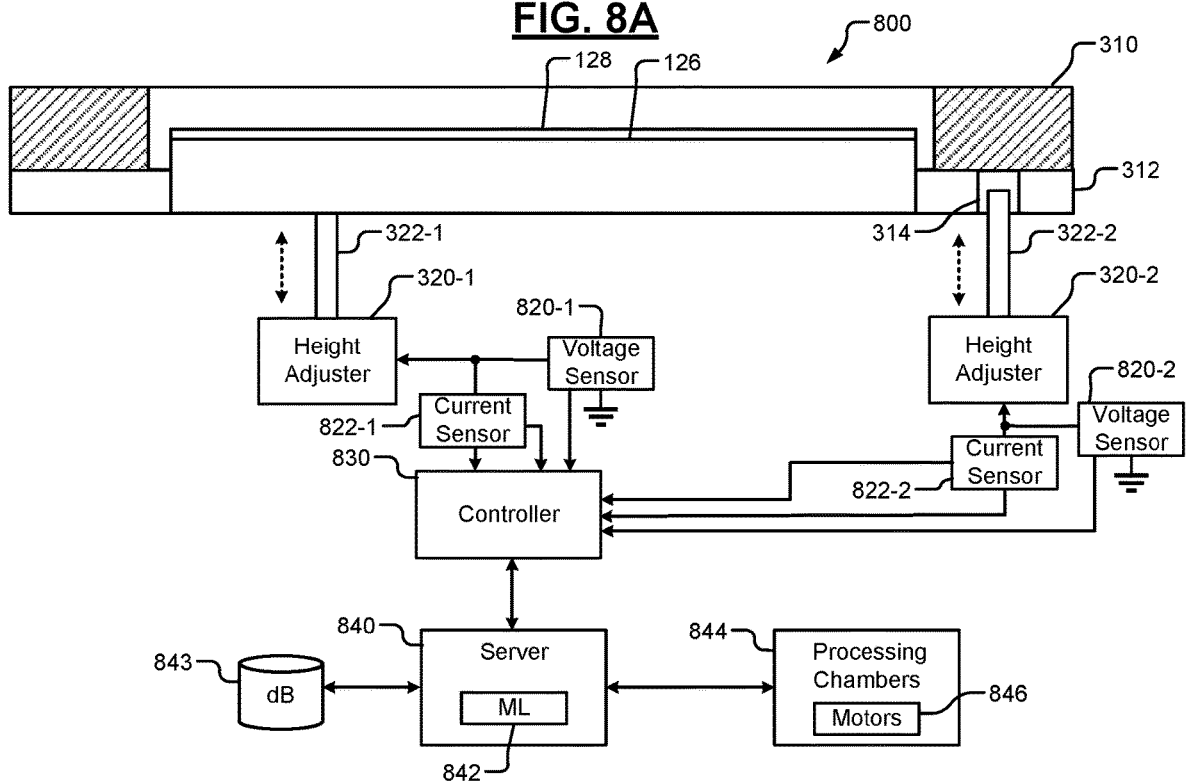
FIG. 8A is a functional block diagram of another example of a height monitoring system according to the present disclosure.

Referring now to FIG. 8A, a height monitoring system 800 includes the height adjusters 320 and pins 322. The height adjusters 320 include motors. A controller 830 supplies power to the motors in the height adjusters 320. Current sensors 822-1, 822-2, . . . , and 822-N monitor current supplied to the height adjusters 320. Voltage sensors 824-1, 824-2, . . . , and 824-N monitor voltage supplied to the height adjusters 320. The controller 830 determines the weight of the edge ring 310 based upon the current and/or voltage supplied to the height adjusters 320. Then, the controller 830 determines the thickness of the edge ring based upon the weight.

The motor in the height adjuster 320 draws current, voltage and/or power during movement of the edge ring 310. The current, voltage and/or power are measured and correlated to weight. In other words, more power is needed to move a thicker (or heavier) edge ring 310 as compared to a thinner (or lighter) edge ring 310. In some examples, the controller 830 may be programmed to use a formula or lookup table that stores a correlation between motor current and edge ring thickness.

In some examples, changes or fluctuations in measured motor parameters or signals (amplitude/frequency/phase/etc.) can be correlated to health of the lift mechanism such as the motors, bearings and/or power transmission components. The motor parameters or signals that are measured can be transmitted to a remote server 840. The remote server 840 stores the signals and/or data in a database 843 along with motor parameters and/or signals of motors 846 associated with other processing chambers 844. A machine learning module 842 correlates the motor parameters or signals to healthy motors and unhealthy motors. Examples of machine learning algorithms include neural networks, tensor flow, logistic regression and other machine learning algorithms. The remote server 840 evaluates the health of the motors and returns results of the analysis to the controller 830 or another component of the processing chamber. The controller 830 or other component of the processing chamber generates a notification and maintenance, or other action may be initiated to reduce tool down time and unplanned tool shut down.

Figure 8B:
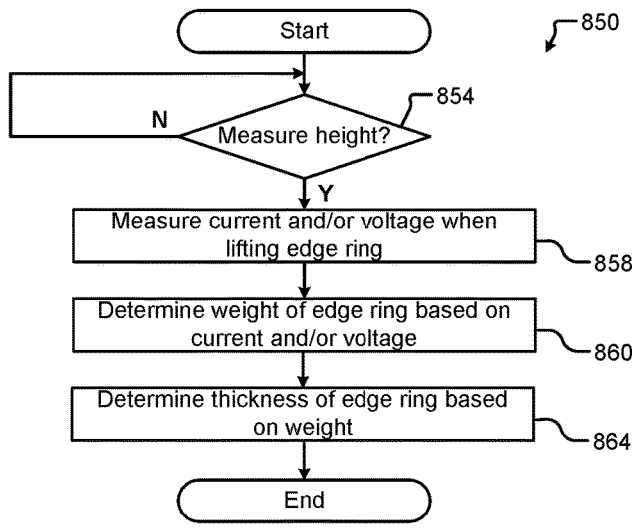
FIG. 8B is a flowchart of a method for operating the height monitoring system of FIG. 8A.

Referring now to FIG. 8B, a method 850 for operating the height monitoring system 800 is shown. As can be appreciated, the steps shown in the method 850 may be performed in a closed loop manner as shown in FIG. 4. At 854, the method determines whether the thickness of the edge ring should be measured. If 854 is true, current and/or voltage of motors in the height adjusters 320 are monitored. At 860, the weight of the edge ring 310 is determined based upon the current and/or voltage signals. At 864, the thickness of the edge ring 310 is determined based upon the weight.

Figure 8C:
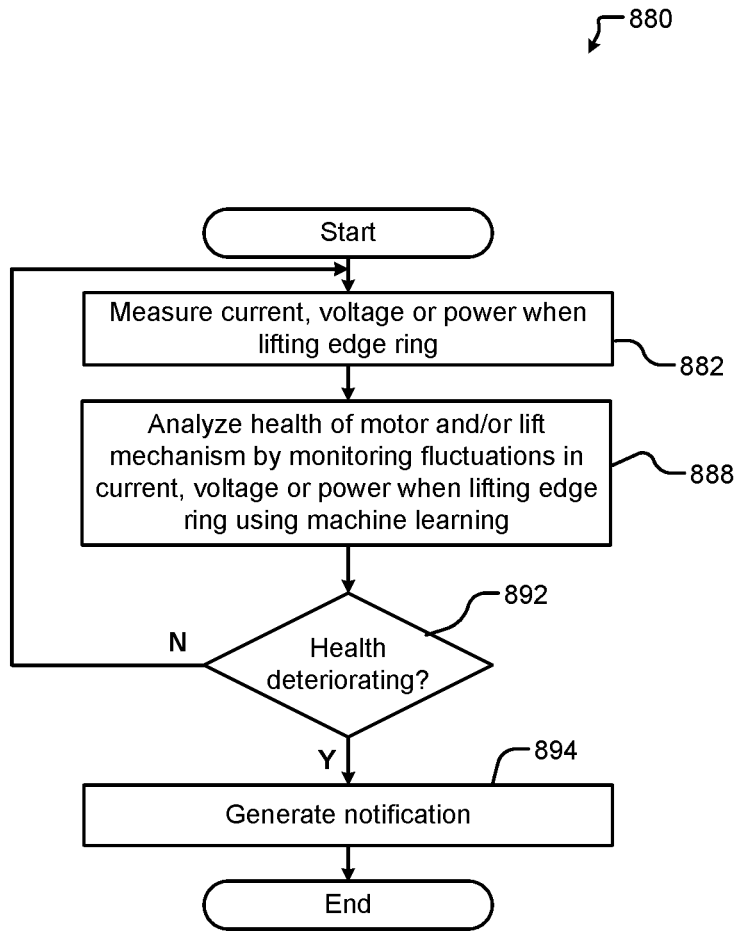
FIG. 8C is a flowchart of a method for determining the health of a motor and lift mechanism in a height adjuster using machine learning algorithms according to the present disclosure.

Referring now to FIG. 8C, a method 880 for monitoring health of the motor and the height adjuster is shown. At 882, current, voltage and/or power are measured when lifting the edge ring. At 888, the health of the motor and/or lift mechanism components is analyzed based upon the fluctuations in the current, voltage and/or power when lifting the edge ring using machine learning algorithms. If the health of the motor and/or lift mechanism is deteriorating as determined at 892, a notification is generated at 894. Otherwise, the method returns to 882. As can be appreciated, machine learning health check routine can be used for motors and lift mechanism components associated with any of the preceding examples.

Figure 9A:
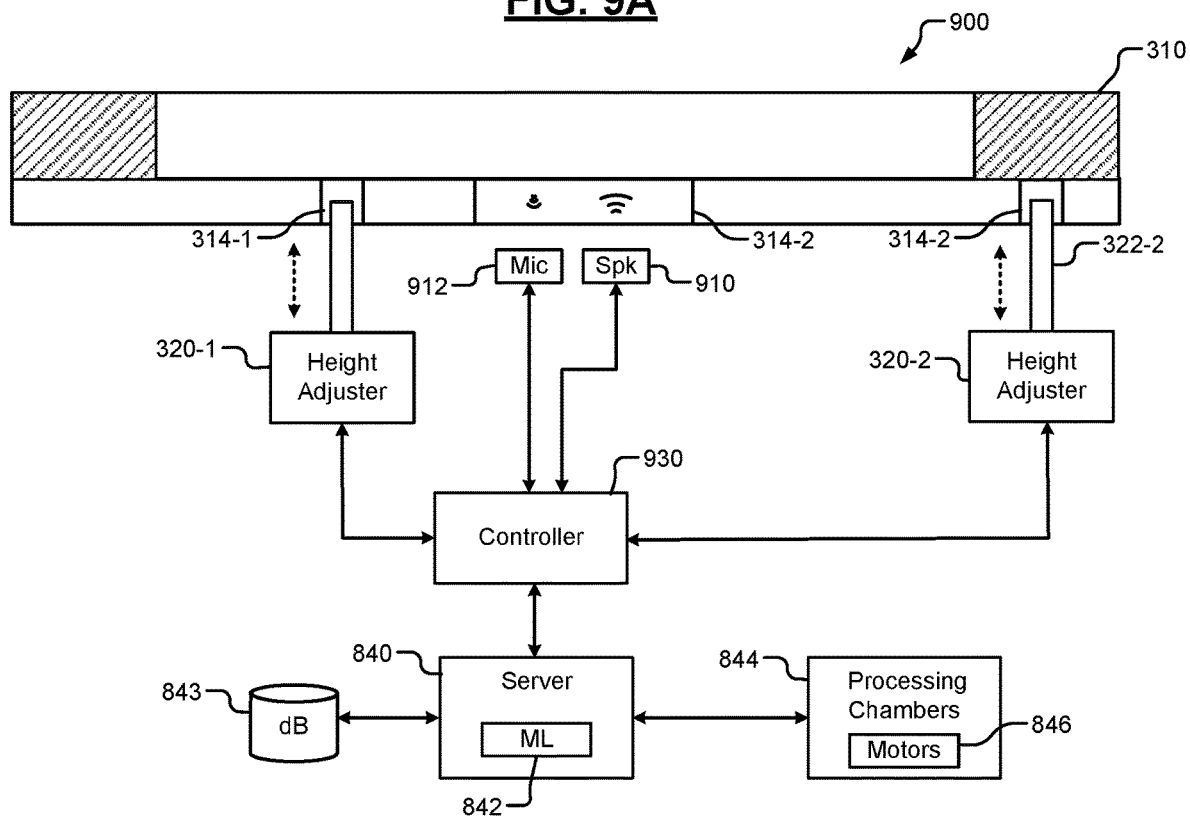
FIG. 9A is a functional block diagram of another example of a height monitoring system including a speaker and microphone according to the present disclosure.

Referring now to FIG. 9A, a height monitoring system 800 includes the height adjusters 320. The substrate 128 and the substrate support 126 are omitted for purposes of illustration. A controller 930 controls the height adjusters 320. One or more speakers 910 and microphones 912 are provided. In some examples, the one or more speakers 910 and microphones 912 are arranged a predetermined distance from the edge ring 310 during measurement. When a thickness measurement is needed, the controller 930 causes the speaker 910 to output a first signal at a predetermined frequency. In some examples, the predetermined frequency is in a range from 1 kHz to 20 kHz. In other examples, the predetermined frequency is in a range from 5 kHz to 30 kHz. In still other examples, the predetermined frequency is in a range from 10 kHz to 20 kHz.

The microphone 912 receives first and second reflected signals. The first reflected signal corresponds to the first signal reflecting from the lower surface of the edge ring 310. The second reflected signal corresponds to the reflection of the first signal from the upper surface of the edge ring 310 after traveling through the edge ring 310. The thickness of the edge ring 310 can be determined based on the timing of the first signal relative to the second reflected signal.

Figure 9B:
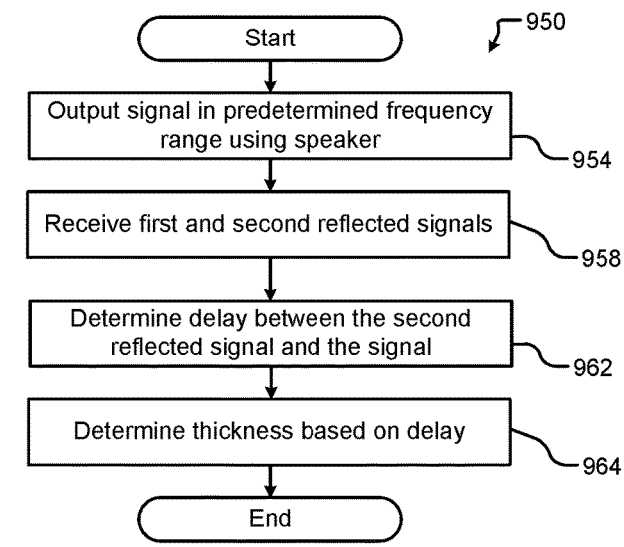
FIG. 9B is a flowchart of a method for operating the height monitoring system of FIG. 9A.

Referring now to FIG. 9B, a method 950 for measuring the thickness of the edge ring is shown. At 954, the signal is output in a predetermined frequency range using speaker. At 958, first and second reflected signals are received by the microphone. 962, a delay between the signal and the second reflected signal is determined. At 964, the thickness is determined based on the delay.

More particularly, the calculation of the thickness will depend upon the delay, the distance between the microphone and/or speaker and the edge ring, the material of the edge ring and the ambient environment.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A measurement system to measure a thickness of an edge ring in a plasma processing chamber, comprising:
    an ultrasound transducer configured to output an ultrasound signal into the edge ring and to receive a reflected signal from the edge ring;
    a first height adjuster configured to adjust a height of the ultrasound transducer relative to the edge ring; and
    a controller configured, based on position of the ultrasound transducer, to cause the ultrasound transducer to generate the ultrasound signal and to determine the thickness of the edge ring based on timing of the ultrasound signal and the reflected signal.

2. The measurement system of claim 1, further comprising a second height adjuster configured to adjust a height of the edge ring relative to a surface in the plasma processing chamber.

3. The measurement system of claim 2, wherein the controller is configured to control the second height adjuster to adjust the height of the edge ring relative to the surface based on the thickness.

4. The measurement system of claim 1, wherein the controller is configured, prior to causing the ultrasound transducer to generate the ultrasound signal, to control the first height adjuster to move the ultrasound transducer in contact with the edge ring.

5. The measurement system of claim 4, further comprising a pin arranged between the first height adjuster and the ultrasound transducer.

6. The measurement system of claim 4, further comprising a pin arranged between the ultrasound transducer and the edge ring.

7. The measurement system of claim 1, wherein the ultrasound transducer is in direct contact with the edge ring.

8. The measurement system of claim 1, wherein the controller is configured to selectively cause the edge ring to be replaced in response to the thickness.

9. The measurement system of claim 2, wherein the ultrasound transducer is arranged between the first height adjuster and the edge ring.

10. The measurement system of claim 1, further comprising:
   a second height adjuster including a motor and configured to adjust a height of the edge ring relative to a surface; and
   at least one sensor configured to sense a parameter of the motor and selected from a group consisting of a current sensor and a voltage sensor,
   wherein the controller is configured to determine a weight of the edge ring based on an output of the at least one sensor, and to determine the thickness of the edge ring based on the weight.

11. The measurement system of claim 10, wherein, using the second height adjuster, the controller adjusts the height of the edge ring relative to the surface based on the thickness.

12. The measurement system of claim 10, further comprising a pin arranged between the second height adjuster and the edge ring.

13. The measurement system of claim 10, wherein the controller is configured to selectively cause the edge ring to be replaced in response to the thickness.

14. The measurement system of claim 10, further comprising:
   a server remote from the controller, wherein the controller is a first controller and sends the output of the at least one sensor to the server; and
   a plurality of processing chambers each including a controller, a height adjuster and a respective sensor, wherein the controller of each of the plurality of processing chambers is configured to send an output of the respective sensor to the server, wherein one of the controllers of one of the plurality of processing chambers is the first controller,
   wherein the server uses a machine learning algorithm to evaluate a health status of the edge ring based on the output of the at least one sensor and the output of the respective sensor of each of the plurality of processing chambers.

15. A measurement system to measure a thickness of an edge ring in a plasma processing chamber, comprising:
   an ultrasound transducer configured to output an ultrasound signal into the edge ring and to receive a reflected signal from the edge ring;
   a first controller configured to cause the ultrasound transducer to generate the ultrasound signal and to determine the thickness of the edge ring based on timing of the ultrasound signal and the reflected signal;
   a server remote from the first controller, wherein the first controller sends an output of the ultrasound transducer to the server; and
   a plurality of processing chambers each including a controller, a height adjuster and a sensor, wherein the controller of each of the plurality of processing chambers is configured to send an output of the corresponding sensor to the server, wherein one of the controllers of one of the plurality of processing chambers is the first controller, and wherein one of the sensors is the ultrasound transducer,
   wherein the server uses a machine learning algorithm to evaluate a health status of the edge ring based on the output of the ultrasound transducer and the output of the corresponding sensor of each of the plurality of processing chambers.

* * * * *